(12) United States Patent
Nelson et al.

(10) Patent No.: US 12,500,585 B2
(45) Date of Patent: Dec. 16, 2025

(54) OPTIMIZATION OF POWER MODULE PERFORMANCE VIA PARASITIC MUTUAL COUPLING

(71) Applicant: Wolfspeed, Inc., Durham, NC (US)

(72) Inventors: Blake Whitmore Nelson, Fayetteville, AR (US); Brian DeBoi, Northport, AL (US); Daniel John Martin, Fayetteville, AR (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/429,613

(22) Filed: Feb. 1, 2024

(65) Prior Publication Data

US 2024/0223176 A1 Jul. 4, 2024

Related U.S. Application Data

(63) Continuation of application No. 17/849,676, filed on Jun. 26, 2022, now Pat. No. 11,936,368.

(51) Int. Cl.
*H03K 17/041* (2006.01)
*H03K 17/687* (2006.01)

(52) U.S. Cl.
CPC ..... *H03K 17/04106* (2013.01); *H03K 17/687* (2013.01); *H03K 2217/0063* (2013.01); *H03K 2217/0072* (2013.01)

(58) Field of Classification Search
CPC ........... H03K 17/04106; H03K 17/687; H03K 2217/0063; H03K 2217/0072; H02M 7/003
See application file for complete search history.

(56) References Cited

U.S. PATENT DOCUMENTS

| | | |
|---|---|---|
| 9,660,643 B2 | 5/2017 | Wang et al. |
| 10,141,923 B2 | 11/2018 | Shin |
| 10,212,838 B2 | 2/2019 | McPherson et al. |
| 10,405,450 B2 | 9/2019 | McPherson et al. |
| 10,749,443 B2 | 8/2020 | Martin et al. |
| 10,917,992 B2 | 2/2021 | Feurtado et al. |
| 11,522,536 B2 | 12/2022 | Yu et al. |
| 11,696,417 B2 | 7/2023 | Feurtado et al. |

(Continued)

*Primary Examiner* — Menatoallah Youssef
*Assistant Examiner* — Colleen J O Toole
(74) *Attorney, Agent, or Firm* — Dority & Manning, P.A.

(57) ABSTRACT

The present disclosure relates to a power module with a power path extending through a first field-effect transistor (FET) and a second FET. A primary conductive structure connecting the first FET and the second FET in series provides a primary parasitic inductor within the power path. A first secondary conductive structure connected to both a gate and a source of the first FET provides a first secondary parasitic inductor within a first gate path, and a second secondary conductive structure connected to both a gate and a source of the second FET provides a second secondary parasitic inductor within a second gate path. The first secondary conductive structure and the second secondary conductive structure are configured such that mutual coupling between the first secondary parasitic inductor and the primary parasitic inductor and mutual coupling between the second secondary parasitic inductor and the primary parasitic inductor are substantially symmetrical.

19 Claims, 12 Drawing Sheets

(56) References Cited

U.S. PATENT DOCUMENTS

| | | |
|---|---|---|
| 2020/0304037 A1 | 9/2020 | Martin et al. |
| 2021/0136947 A1 | 5/2021 | Feurtado et al. |
| 2021/0313256 A1* | 10/2021 | McPherson ....... H01L 23/49861 |
| 2022/0262735 A1 | 8/2022 | Martin et al. |
| 2023/0178490 A1* | 6/2023 | Gui ......................... H02M 1/44 |
| | | 257/773 |

* cited by examiner

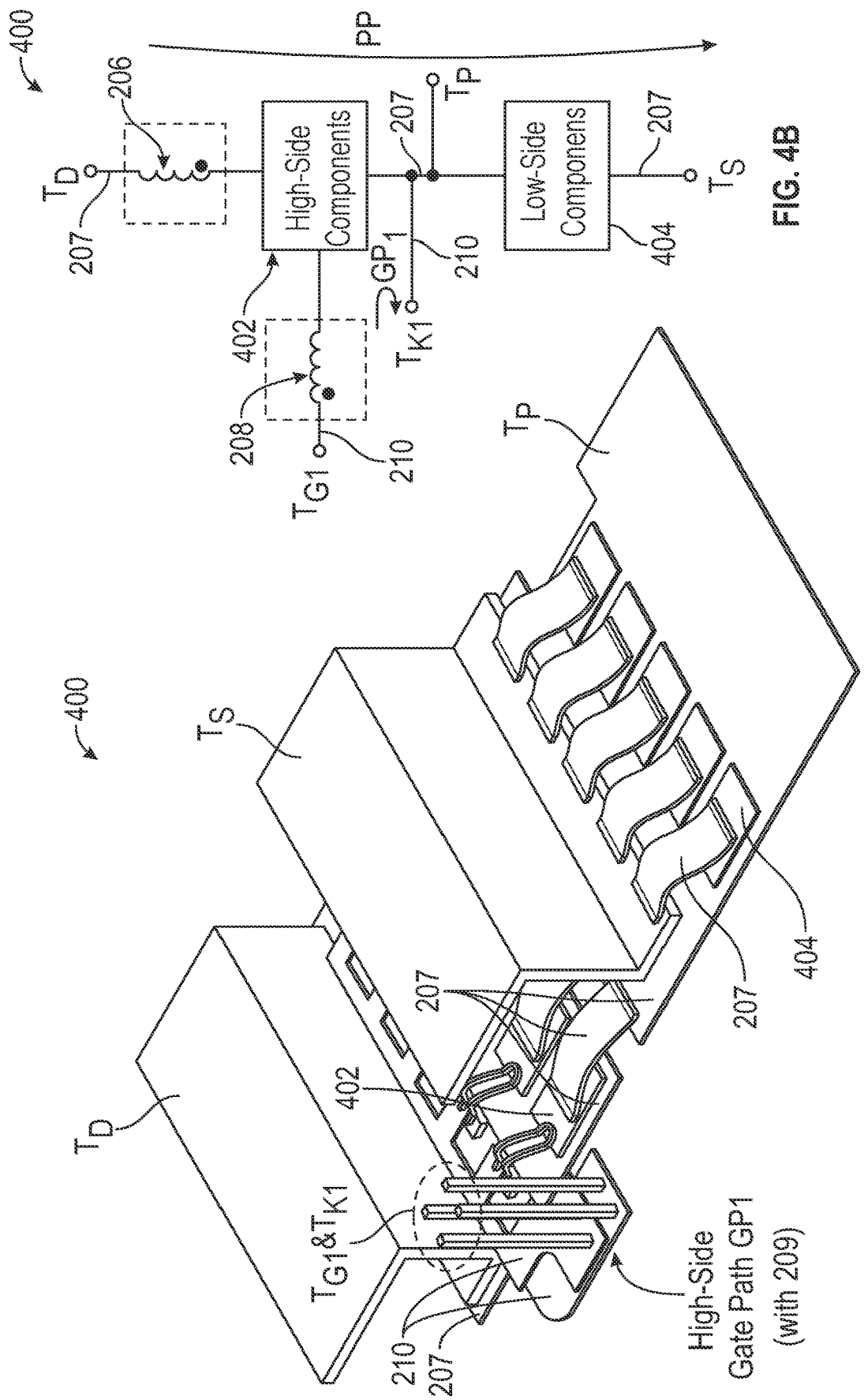

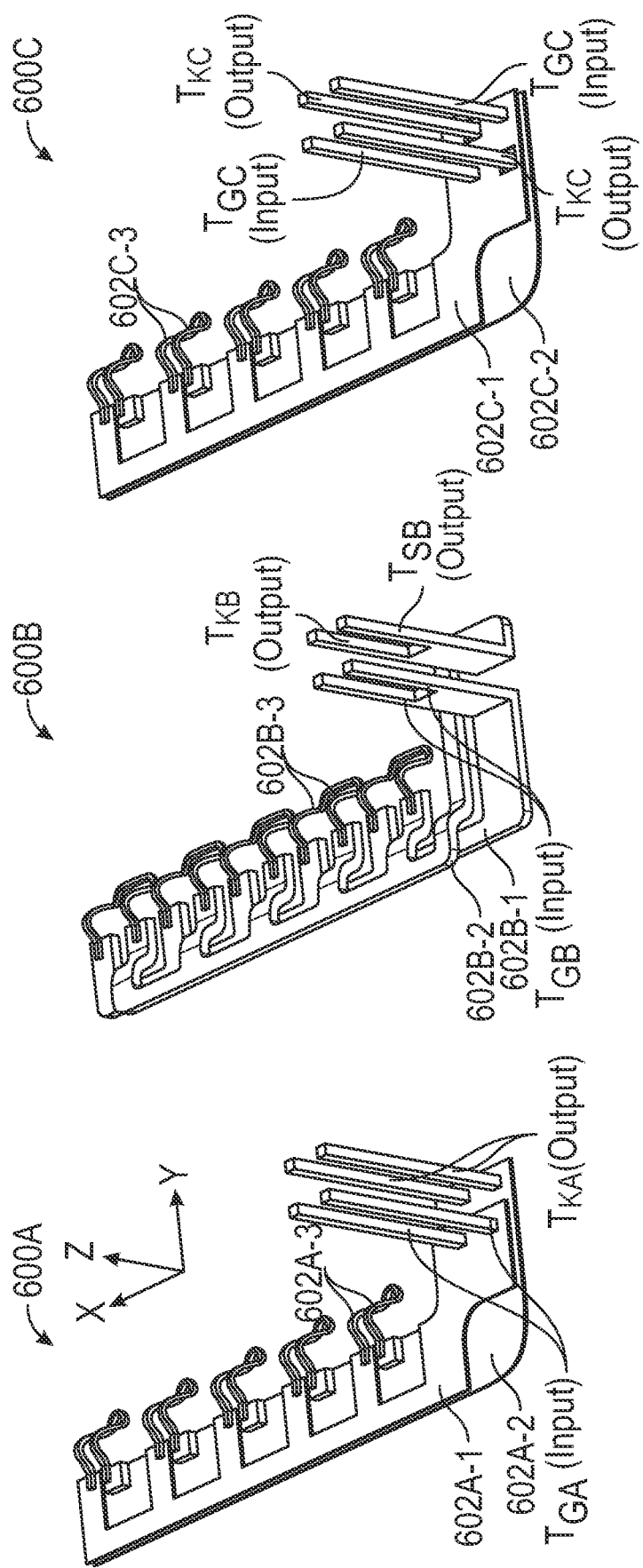
FIG. 6A  Single-Dimensional-Symmetric-Pin
FIG. 6B  Over-Molded
FIG. 6C  Cross-Pin

OPTIMIZATION OF POWER MODULE PERFORMANCE VIA PARASITIC MUTUAL COUPLING

PRIORITY CLAIM

The present application is a continuation of U.S. application Ser. No. 17/849,676 having a filing date of Jun. 26, 2022. Applicant claims priority to and the benefit of each of such applications and incorporate all such applications herein by reference in its entirety.

FIELD OF THE DISCLOSURE

The present disclosure is related to a power module with optimized dynamic performance utilizing parasitic mutual coupling.

BACKGROUND

Power modules, which selectively deliver power to a load, are widely used for power applications, such as motors, inverters, generators, and the like. The primary function of a power module is provided by one or more semiconductor switching devices (e.g., transistors and diodes). The power modules often deal with relatively high voltages and currents, and thus the semiconductor switching devices must similarly be capable of reliably switching these high voltages and currents.

Conventionally, internal gate resistors and/or other components might be utilized in the power modules to control/affect the dynamic performance of the semiconductor switching devices. However, this would increase the design challenge for manufacturability and device reliability, and consequently may increase the final cost and the footprint of the final product.

In light of the above, there is a present need for improved power module designs, which could optimize the dynamic performance without sacrificing manufacturability and device reliability. Further, there is also a need to keep the final product easy to implement, cost effective, and size effective.

SUMMARY

The present disclosure relates to a power module with optimized dynamic performance utilizing parasitic mutual coupling. The disclosed power module includes a power path, a first gate path, and a second gate path. The power path includes a first field-effect transistor (FET), a second FET, and a primary conductive structure configured to connect the first FET and the second FET in series. The first gate path includes a first secondary conductive structure that is connected to both a gate and a source of the first FET, and the second gate path includes a second secondary conductive structure that is connected to both a gate and a source of the second FET. Herein, a primary parasitic inductor exists within the power path due to a geometric configuration of the primary conductive structure, a first secondary parasitic inductor exists within the first gate path due to a geometric configuration of the first secondary conductive structure, and a second secondary parasitic inductor exists within the second gate path due to a geometric configuration of the second secondary conductive structure. The first secondary conductive structure and the second secondary conductive structure are configured such that mutual coupling between the first secondary parasitic inductor and the primary parasitic inductor and mutual coupling between the second secondary parasitic inductor and the primary parasitic inductor are substantially symmetrical.

In one embodiment of the power module, the power path further includes a number of high-side FETs and a number of low-side FETs. These high-side FETs are coupled in parallel with one another, and the first FET is one of the high-side FETs. The low-side FETs are coupled in parallel with one another, and the second FET is one of the low-side FETs.

In one embodiment of the power module, both the first FET and the second FET are metal-oxide-semiconductor FETs (MOSFETs).

In one embodiment of the power module, the primary conductive structure includes a drain terminal, a source terminal, a phase terminal, and a number of primary connecting components. Herein, the power path extends from the drain terminal to the source terminal through the phase terminal, and the primary connecting components are configured to connect the first FET between the drain terminal and the phase terminal and configured to connect the second FET between the phase terminal and the source terminal. The first gate path is physically embedded between the drain terminal and the source terminal, and the second gate path is physically located next to the phase terminal, or the first gate path is physically located next to the drain terminal, and the second gate path is physically embedded between the source terminal and the phase terminal.

In one embodiment of the power module, the first secondary conductive structure includes a first gate terminal, a first Kelvin terminal, and a number of first gate connecting components, while the second secondary conductive structure includes a second gate terminal, a second Kelvin terminal, and a number of second gate connecting components. Herein, the first gate path extends from the first gate terminal, through a gate-to-source of the first FET, and to the first Kelvin terminal. The second gate path extends from the second gate terminal, through a gate-to-source of the second FET, and to the second Kelvin terminal. The first gate connecting components are configured to connect the first gate terminal to the gate of the first FET and connect the first Kelvin terminal to the source of the first FET. The second gate connecting components are configured to connect the second gate terminal to the gate of the second FET and connect the second Kelvin terminal to the source of the second FET.

In one embodiment of the power module, the first gate terminal is composed of two first input pins, and the first Kelvin terminal is composed of two first output pins. The two first input pins of the first gate terminal and the two first output pins of the first Kelvin terminal are configured symmetrically in both an X dimension and a Y dimension without symmetry in a Z dimension. The X dimension, the Y dimension, and the Z dimension are orthogonal to each other.

In one embodiment of the power module, the first gate connecting components include a first input metal layer, a first output metal layer, and a number of first wire leads configured to connect the first input metal layer and the first output metal layer to the first FET. Herein, the first input metal layer is vertically aligned with the first output metal layer. The two first input pins are in contact with the first input metal layer and extend upward from a top surface of the first input metal layer along the Z dimension. The two first output pins are in contact with the first output metal layer and extend upward from a top surface of the first output metal layer along the Z dimension. The two first output pins extend vertically through the first input metal layer without contact.

In one embodiment of the power module, the second gate terminal is composed of two second input pins, and the second Kelvin terminal is composed of two second output pins. Herein, the two second input pins of the second gate terminal and the two second output pins of the second Kelvin terminal are configured symmetrically in both the X dimension and the Y dimension without symmetry in the Z dimension.

In one embodiment of the power module, the second gate connecting components include a second input metal layer, a second output metal layer, and a number of second wire leads configured to connect the second input metal layer and the second output metal layer to the second FET. Herein, the second input metal layer is vertically aligned with the second output metal layer. The two second input pins of the second gate terminal are in contact with the second input metal layer and extend upward from a top surface of the second input metal layer along the Z dimension. The two second output pins of the second Kelvin terminal are in contact with the second output metal layer and extend upward from a top surface of the second output metal layer along the Z dimension. The two second output pins of the second Kelvin terminal extend vertically through the second input metal layer without contact.

According to one embodiment, a first alternative power module with optimized dynamic performance has a power path and a first gate path. The power path includes a first FET and a primary conductive structure that is connected to both a drain and a source of the first FET. A primary parasitic inductor exists within the power path due to a geometric configuration of the primary conductive structure. The first gate path includes a first secondary conductive structure with a first gate terminal, a first Kelvin terminal, and a number of first gate connecting components. Herein, the first gate path extends from the first gate terminal to the first Kelvin terminal, and the first gate connecting components are configured to connect the first gate terminal to a gate of the first FET and connect the first Kelvin terminal to the source of the first FET. The first gate terminal is composed of two first input pins, and the first Kelvin terminal is composed of two first output pins. The two first input pins and the two first output pins are configured symmetrically in both an X dimension and a Y dimension without symmetry in a Z dimension. Herein, the X dimension, the Y dimension, and the Z dimension are orthogonal to each other. A first secondary parasitic inductor exists within the first gate path due to a geometric configuration of the first secondary conductive structure, and the first secondary parasitic inductor and the primary parasitic inductor are mutually coupled.

In one embodiment of the first alternative power module, the power path further includes a number of FETs, which are coupled in parallel with one another. Herein, the first FET is one of the FETs. Each of the FETs is a MOSFET.

In one embodiment of the first alternative power module, the first gate connecting components include an input metal layer, an output metal layer, and a number of wire leads configured to connect the input metal layer and the output metal layer to the first FET. Herein, the input metal layer is vertically aligned with the output metal layer. The two input pins are in contact with the input metal layer and extend upward from a top surface of the input metal layer along the Z dimension. The two output pins are in contact with the output metal layer and extend upward from a top surface of the output metal layer along the Z dimension. The two first output pins extend vertically through the input metal layer without contact.

In one embodiment of the first alternative power module, the mutual coupling between the first secondary parasitic inductor and the primary parasitic inductor has a negative effect for a switching speed of the first FET.

According to one embodiment, the first alternative power module further includes a second gate path, which includes a second secondary conductive structure with a second gate terminal, a second Kelvin terminal, and a number of second gate connecting components. Herein, the power path further includes a second FET, and the primary conductive structure is configured to connect the first FET and the second FET in series. The second gate path extends from the second gate terminal to the second Kelvin terminal, and the second gate connecting components are configured to connect the second gate terminal to a gate of the second FET and connect the second Kelvin terminal to a source of the second FET.

In one embodiment of the first alternative power module, the primary conductive structure includes a drain terminal, a source terminal, a phase terminal, and a number of primary connecting components. The power path extends from the drain terminal to the source terminal through the phase terminal, and the primary connecting components are configured to connect the first FET between the drain terminal and the phase terminal and configured to connect the second FET between the phase terminal and the source terminal.

According to one embodiment, a second alternative power module with optimized dynamic performance has a power path and a first gate path. The power path includes a first FET and a primary conductive structure that is connected to both a drain and a source of the first FET. The primary parasitic inductor exists within the power path due to a geometric configuration of the primary conductive structure. The first gate path includes a first secondary conductive structure with a first gate terminal, a first Kelvin terminal, and a number of first gate connecting components. Herein, the first gate path extends from the first gate terminal to the first Kelvin terminal, and the first gate connecting components are configured to connect the first gate terminal to a gate of the first FET and connect the first Kelvin terminal to the source of the first FET. The first gate terminal is composed of two first input pins, and the first Kelvin terminal is composed of two first output pins. The two first input pins and the two first output pins are configured symmetrically in an X dimension without symmetry in a Y dimension and a Z dimension. Herein, the X dimension, the Y dimension, and the Z dimension are orthogonal to each other. The first gate connecting components include a first input metal layer in contact with the two first input pins and a first output metal layer in contact with the two first output pins. The first input metal layer has a first comb shape with multiple comb teeth, and the first output metal layer has a second comb shape with multiple comb teeth. The teeth of the first comb configuration and the teeth of the second comb configuration face a same direction and are staggered. A first secondary parasitic inductor exists within the first gate path due to a geometric configuration of the first secondary conductive structure, and the first secondary parasitic inductor and the primary parasitic inductor are mutually coupled.

In one embodiment of the second alternative power module, the power path further includes a number of FETs, which are coupled in parallel with one another, and the first FET is one of the FETs. Each of the FETs is a MOSFET.

In one embodiment of the second alternative power module, the mutual coupling between the first secondary parasitic inductor and the primary parasitic inductor has a positive effect for a switching speed of the first FET.

According to one embodiment, the second alternative power module further includes a second gate path, which includes a second secondary conductive structure with a second gate terminal, a second Kelvin terminal, and a number of second gate connecting components. Herein, the power path further includes a second FET, and the primary conductive structure is configured to connect the first FET and the second FET in series. The second gate path extends from the second gate terminal to the second Kelvin terminal, and the second gate connecting components are configured to connect the second gate terminal to a gate of the second FET and connect the second Kelvin terminal to a source of the second FET.

In one embodiment of the second alternative power module, the primary conductive structure includes a drain terminal, a source terminal, a phase terminal, and a number of primary connecting components. The power path extends from the drain terminal to the source terminal through the phase terminal, and the primary connecting components are configured to connect the first FET between the drain terminal and the phase terminal and configured to connect the second FET between the phase terminal and the source terminal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 4A-4B illustrate a simulation model for estimating a parasitic mutual coupling effect within the power module shown in FIG. 2A.

FIGS. 6A-6C illustrate different geometric configurations of a conductive structure within one gate path according to some embodiments of the present disclosure.

Figure 1A:
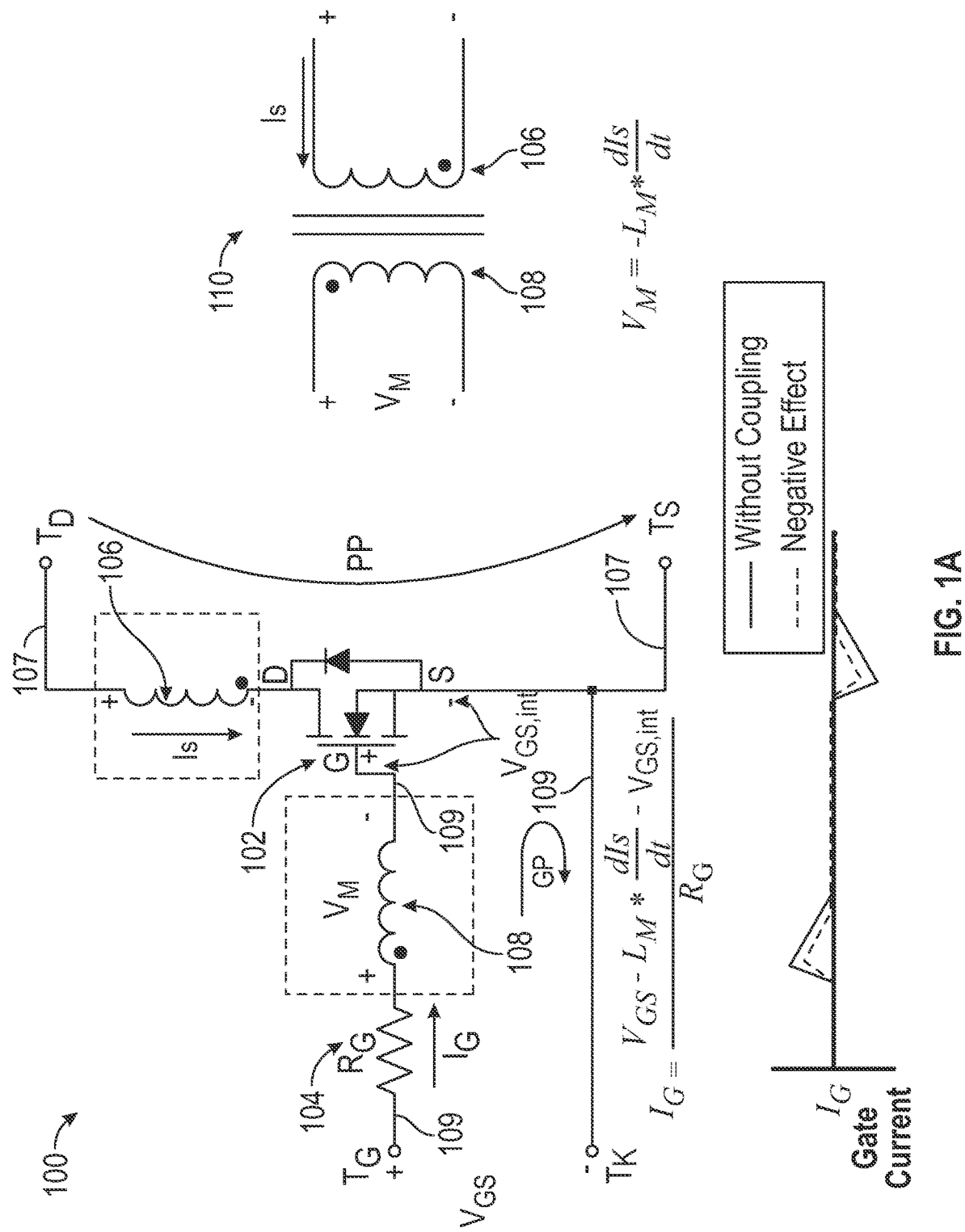
FIGS. 1A-1B illustrate a schematic of a single metal-oxide-semiconductor field-effect transistor (MOSFET) power module with parasitic mutual coupling.

It will be understood that for clear illustrations, FIGS. 1-10 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

As manufacturing technologies develop, high power applications shift to higher frequencies and higher levels of integration. Multiple components for all or a portion of a circuit are often packaged in electronic modules. Parasitic effects from the geometric configuration of interconnections may significantly affect the dynamic performance of the electronic modules. The present disclosure relates to power modules used in high power applications. The power modules may contain one or more power semiconductor devices, such as metal-oxide-semiconductor field-effect transistors (MOSFETs), insulated gate bipolar transistors (IGBTs), diodes, and the like, arranged into a variety of circuit topologies. Typical circuit topologies include, but are not limited to, a single switch, a half H-bridge circuit, a full H-bridge circuit, and a three-phase switching circuit, which is often referred to as a six-pack. For the following discussion, a single switch and a half-bridge circuit are used to facilitate an understanding of the packaging concepts disclosed herein.

Figure 1B:
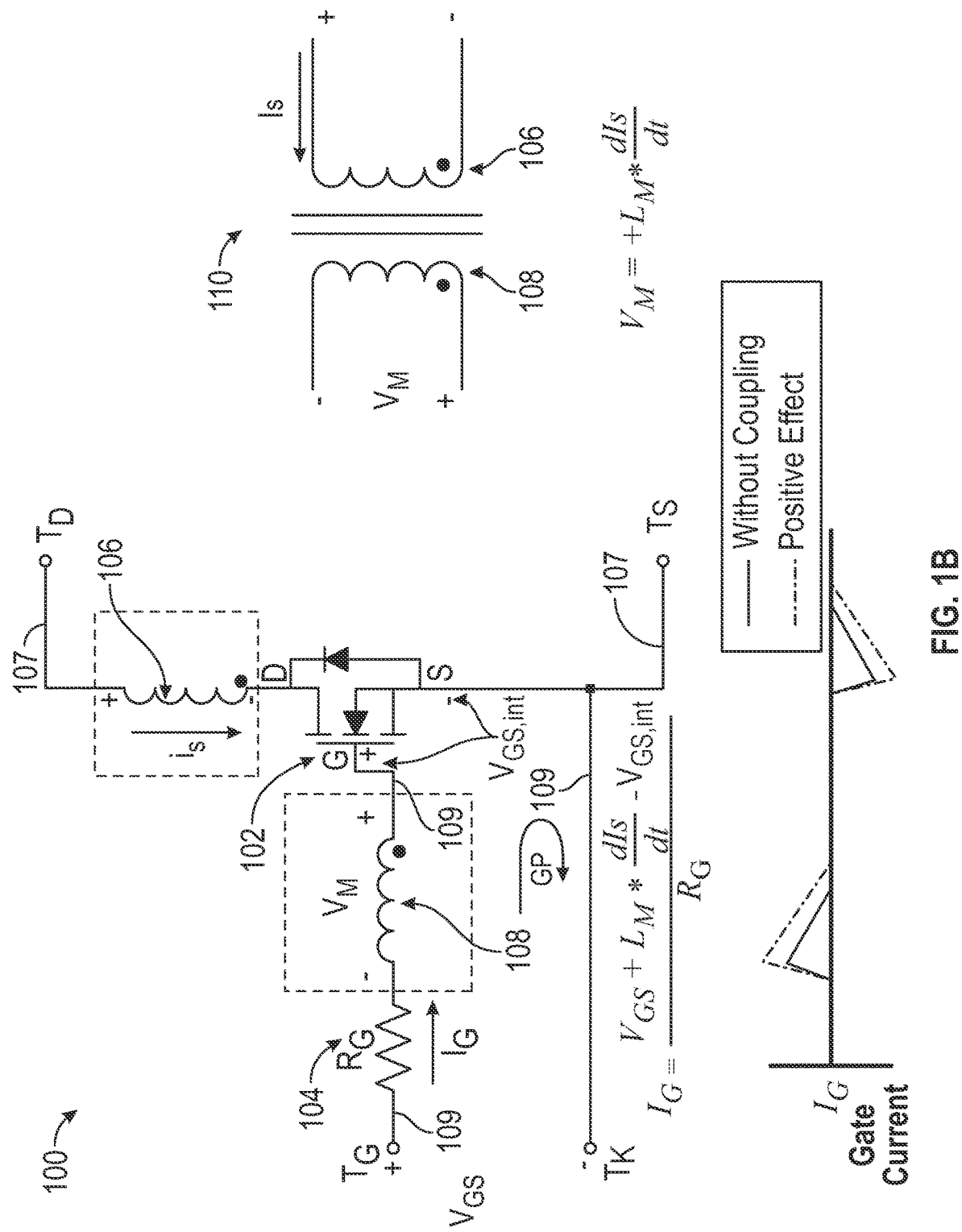

FIGS. 1A-1B illustrate a schematic of a single transistor power module 100 with parasitic mutual coupling. Herein, the single transistor power module 100 has a power path PP extending from a drain terminal $T_D$, through a transistor 102, and to a source terminal $T_S$, and a gate path GP extending from a gate terminal $T_G$ to a Kelvin terminal $T_K$. In one embodiment, the drain terminal $T_D$ is connected to a positive direct current (DC) voltage (not shown), the source terminal $T_S$ is connected to a negative/zero DC voltage (not shown), and a gate-source voltage $V_{GS}$ is applied between the gate terminal $T_G$ and the Kelvin terminal $T_K$. For a non-limited example, the transistor 102 is a field-effect transistor (FET) with a drain D, a gate G, and a source S. In particular, the transistor 102 is a power MOSFET.

For the following discussion, the transistor 102, the FET 102, and the MOSFET 102 refer to a same component. Herein, the drain D of the MOSFET 102 is coupled to the drain terminal $T_D$ and the source S of the MOSFET 102 is coupled to the source terminal $T_S$. The gate path GP extends through a gate resistor 104 and a gate-to-source G-S of the MOSFET 102. The gate resistor 104 is coupled between the gate terminal $T_G$ and the gate of the MOSFET 102, and the source of the MOSFET 102 is coupled to the Kelvin terminal $T_K$. The source terminal $T_S$ in the power path PP and the Kelvin terminal $T_K$ in the gate path GP are electrically connected.

Within the power path PP, a primary parasitic inductor 106 may exist due to a geometric configuration of a primary conductive structure, which includes the drain terminal $T_D$, the source terminal $T_S$, and primary connecting components 107 configured to connect the MOSFET 102 to the terminals $T_D$ and $T_S$. The primary parasitic inductor 106 may be equivalent to an inductance between the drain terminal $T_D$ and the drain D of the MOSFET 102. Within the gate path GP, a secondary parasitic inductor 108 may exist due to a geometric configuration of a secondary conductive structure, which includes the gate terminal $T_G$, the Kelvin terminal $T_K$, and gate connecting components 109 configured to electrically connect the gate terminal $T_G$, the gate resistor 104, the gate G of the MOSFET 102, the source S of the MOSFET 102, and the Kelvin terminal $T_K$. The secondary parasitic inductor 108 may be equivalent to an inductance between the gate terminal $T_G$ and the gate G of the MOSFET 102. Herein, the primary parasitic inductor 106 and the secondary parasitic inductor 108 are perfectly coupled and form a parasitic transformer 110 with an inductance value $L_M$.

During switching transients, magnetic mutual coupling can transfer energy between the power path PP (i.e., the primary parasitic inductor 106) and the gate path GP (i.e., the secondary parasitic inductor 108), and therefore, influences the dynamics of the power module 100. When a current change event $$\frac{dI_s}{dt}$$

occurs in the power path PP, a mutual voltage $V_M$ across the secondary parasitic inductor 108 will be introduced in the gate path GP.

$$V_M = \pm L_M * \frac{dI_s}{dt} \quad (1)$$

Herein, $I_S$ is a current into the drain of the MOSFET 102, t is time, and $L_M$ is inductance of the primary parasitic inductor 106 and the secondary parasitic inductor 108. In different applications, the polarity of the mutual voltage $V_M$ can be positive or negative.

As illustrated in FIG. 1A, the mutual voltage $V_M$ is opposite the gate-source voltage $V_{GS}$ applied between the gate terminal $T_G$ and the Kelvin terminal $T_K$. As such, a gate current IG injected into the gate of the MOSFET 102 is shown in the equation below.

$$I_G = \frac{V_{GS} + V_M - V_{GS,int}}{R_g} \quad (2)$$

$$= \frac{V_{GS} - L_M * \frac{dI_s}{dt} - V_{GS,int}}{R_G}$$

Herein, $V_{GS,int}$ is an internal voltage across the gate-to-source GS of the MOSFET 102. In this circumstance, the introduced mutual voltage $V_M$ has a negative effect for the gate current $I_G$, thereby slowing down the switching speed of the MOSFET 102.

On the other hand, as illustrated in FIG. 1B, the mutual voltage $V_M$ is with the same polarity as the gate-source voltage $V_{GS}$ applied between the gate terminal $T_G$ and the Kelvin terminal $T_K$. As such, the gate current $I_G$ injected into the gate of the MOSFET 102 is shown in the equation below.

$$I_G = \frac{V_{GS} + V_M - V_{GS,int}}{R_g} \quad (3)$$

$$= \frac{V_{GS} - L_M * \frac{dI_s}{dt} - V_{GS,int}}{R_G}$$

In this circumstance, the introduced mutual voltage $V_M$ has a positive effect for the gate current $I_G$, thereby increasing the switching speed of the MOSFET 102. The polarity of the mutual voltage $V_M$ determines how the influence manifests. In other words, the mutual coupling between the power path PP and the gate path GP may have a positive or negative effect for the switching speed of the MOSFET 102.

Figure 2B:
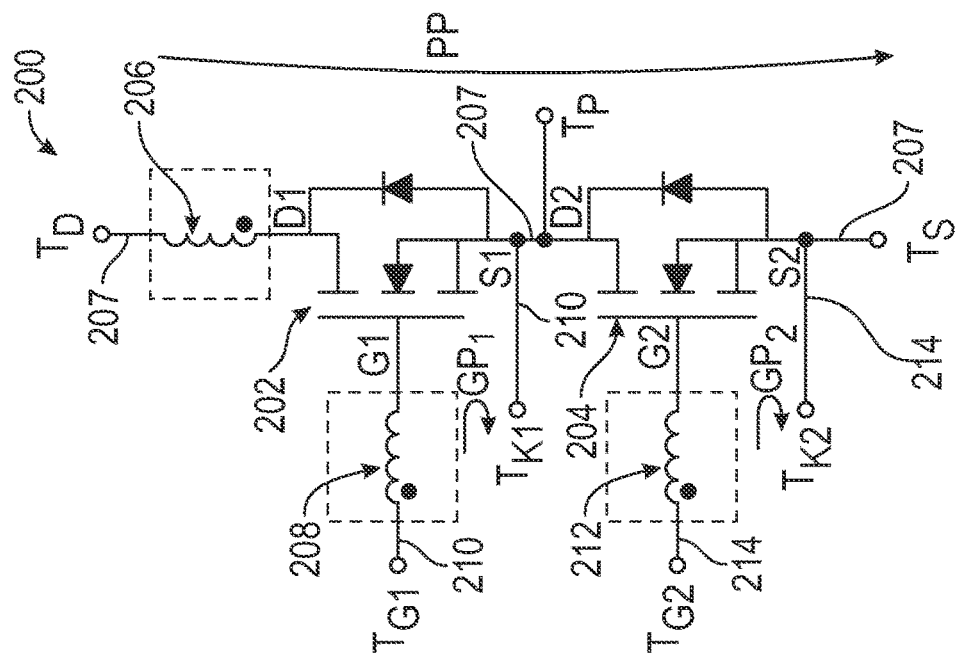
FIGS. 2A-2B illustrate an exemplary half-bridge power module according to some embodiments of the present disclosure.
Figure 2A:
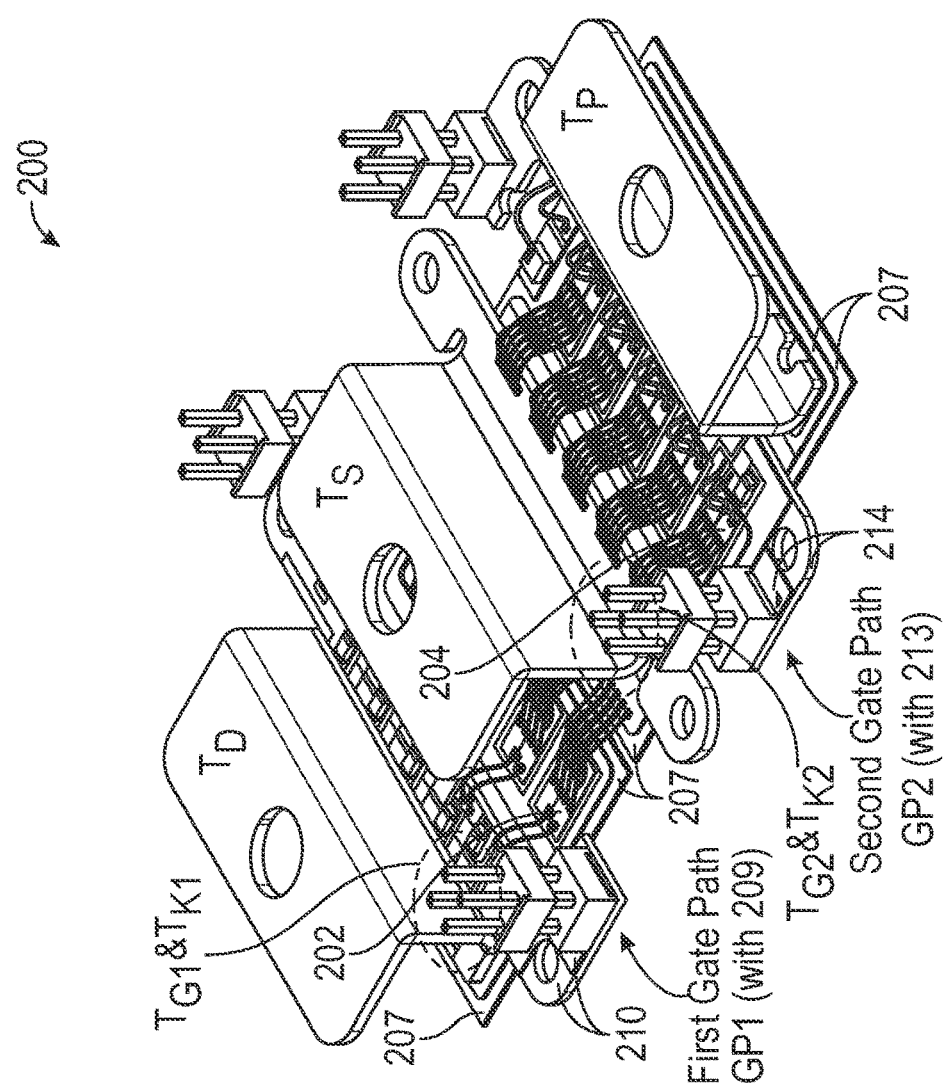

FIGS. 2A-2B illustrate an exemplary half-bridge power module 200, which is used to switch different voltages to a load, such as a motor. FIG. 2A shows a physical structure of the half-bridge power module 200, while FIG. 2B shows a schematic of the half-bridge power module 200. In detail, the half-bridge power module 200 has a power path PP that extends from a drain terminal $T_D$, passing a phase terminal $T_P$, and to a source terminal $T_S$, a first gate path GP1 that extends from a first gate terminal $T_{G1}$ to a first Kelvin terminal $T_{K1}$, and a second gate path GP2 that extends from a second gate terminal $T_{G2}$ to a second Kelvin terminal $T_{K2}$. In one embodiment, the drain terminal $T_D$ is connected to a positive direct current (DC) voltage, the source terminal $T_S$ is connected to a negative DC voltage, the phase terminal $T_P$ is essentially an output node that connects to the load for the half-bridge power module 200, a first gate-source voltage applied between the first gate terminal $T_{G1}$ and the first Kelvin terminal $T_{K1}$, and a second gate-source voltage applied between the second gate terminal $T_{G2}$ and the second Kelvin terminal $T_{K2}$ (not shown).

The key components of the half H-bridge power module 200 are at least one first transistor 202 and at least one second transistor 204, which are coupled in series between the drain terminal $T_D$ and the source terminal $T_S$. For a non-limited example, the at least one first transistor 202 and the at least one second transistor 204 are field-effect transistors (FETs) with drains (D1, D2), gates (G1, G2), and sources (S1, S2), respectively. In particular, the at least one first transistor 202 and the at least one second transistor 204 are power MOSFETs.

For the following discussion, the first transistor 202, the first FET 202, and the first MOSFET 202 refer to a same component, and the second transistor 204, the second FET 204, and the second MOSFET 204 refer to a same component. The power path PP extends through the least one first MOSFET 202 and the at least one second MOSFET 204. In particular, a first drain D1 of the first MOSFET 202 is coupled to the drain terminal $T_D$, a first source S1 of the first MOSFET 202 is coupled to a second drain D2 of the second MOSFET 204, and a second source S2 of the second MOSFET 204 is coupled to the source terminal $T_S$. Herein, a connection point of the first source S1 of the first MOSFET 202 and the second drain D2 of the second MOSFET 204 is coupled to the phase terminal $T_P$.

To increase power handling, multiple power devices may be coupled in parallel with one another. In the illustrated embodiment and as depicted in FIG. 2A, the at least one first transistor 202 is represented by five first transistors 202 that are coupled in parallel with one another (for clarity purposes, only one first transistor is labeled with a reference number in FIG. 2A). The at least one second transistor 204 is represented by five second transistors 204 that are coupled in parallel with one another (for clarity purposes, only one second transistor is labeled with a reference number in FIG. 2A). A total number of the first transistors 202 and a total number of the second transistors 204 may be equal. In different applications, the total number of the first transistor 202 and the total number of the second transistor 204 may be less or more.

The first gate path GP1 extends through a first gate-to-source G1-S1 of each first MOSFET 202, while the second gate path GP2 extends through a second gate-to-source G2-S2 of each second MOSFET 204. In particular, the first gate terminal $T_{G1}$ is coupled to the first gate G1 of each first MOSFET 202, and the first Kelvin terminal $T_{K1}$ is coupled to the first source S1 of each first MOSFET 202. The second gate terminal $T_{G2}$ is coupled to the second gate G2 of each second MOSFET 204, and the second Kelvin terminal $T_{K2}$ is coupled to the second source S2 of each second MOSFET 204. Herein, the first Kelvin terminal $T_{K1}$ in the first gate path GP1 and the phase terminal $T_P$ in the power path PP may be electrically connected. The second Kelvin terminal $T_{K2}$ in the second gate path GP2 and the source terminal $T_S$ in the power path PP are electrically connected.

Within the power path PP, a primary parasitic inductor 206 may exist due to a geometric configuration of a primary conductive structure, which includes the drain terminal $T_D$, the phase terminal $T_P$, the source terminal $T_S$, and primary connecting components 207 configured to connect the first and second MOSFETs 202 and 204 to the terminals $T_D$, $T_P$, and $T_S$ (more details illustrated in FIGS. 4A-4B and 5A-5B and described below). The primary parasitic inductor 206 may be equivalent to an inductance between the drain terminal $T_D$ and the first drain D1 of the first MOSFET(s) 202.

Within the first gate path GP1, a first secondary parasitic inductor 208 may exist due to a geometric configuration of a first secondary conductive structure 209, which includes the first gate terminal $T_{G1}$, the first Kelvin terminal $T_{K1}$, and first gate connecting components 210 configured to electrically connect the first gate terminal $T_{G1}$ to the first gate G1 of each first MOSFET 202 and electrically connect the first Kelvin terminal $T_{K1}$ to the first source S1 of each first MOSFET 202 (more details illustrated in FIGS. 4A-4B and 5A-5B and described below). The first secondary parasitic inductor 208 may be equivalent to an inductance between the first gate terminal $T_{G1}$ and the first gate G1 of the first MOSFET(s) 202. The primary parasitic inductor 206 and the first secondary parasitic inductor 208 are mutually coupled.

Similarly, within the second gate path GP2, a second secondary parasitic inductor 212 may exist due to a geometric configuration of a second secondary conductive structure 213, which includes the second gate terminal $T_{G2}$, the second Kelvin terminal $T_{K2}$, and second gate connecting components 214 configured to electrically connect the second gate terminal $T_{G2}$ to the second gate G2 of each second MOSFET 204 and electrically connect the second Kelvin terminal $T_{K2}$ to the second source S2 of each second MOSFET 204 (more details illustrated in FIGS. 4A-4B and 5A-5B and described below). The second secondary parasitic inductor 212 may be equivalent to an inductance between the second gate terminal $T_{G2}$ and the second gate G2 of the second MOSFET(s) 204. The primary parasitic inductor 206 and the second secondary parasitic inductor 212 are mutually coupled.

For the purpose of this illustration, the mutual coupling between the power path PP and the first gate path GP1 has a negative effect for the switching speed of each first MOSFET 202. Notice that the equivalent first secondary parasitic inductor 208 within the first gate path GP1 is closer to the equivalent primary parasitic inductor 206 within the primary path PP compared to the equivalent second secondary parasitic inductor 212 within the second gate path GP2 (e.g., the first gate path GP1 is physically embedded between the drain terminal $T_D$ and the source terminal $T_S$, while the second gate path GP2, however, is physically located next to the phase terminal $T_P$). As such, the second gate path GP2 is not strongly coupled to the magnetic fields of the power path PP. The mutual coupling between the second secondary parasitic inductor 212 and the primary parasitic inductor 206 may be negligible, and asymmetric to the mutual coupling between the first secondary parasitic inductor 208 and the primary parasitic inductor 206. In other words, the half-bridge power module 200 will feature asymmetrical mutual coupling effects for the first MOSFETs 202 and the second MOSFETs 204. In this case, the mutual coupling between the first secondary parasitic inductor 208 and the primary parasitic inductor 206 is a primary mutual coupling in the half-bridge power module 200 and may have a stronger negative effect for the switching speed of the first MOSFETs 202 than the mutual coupling between the second secondary parasitic inductor 110 and the primary parasitic inductor 206 for the switching speed of the second MOSFETs 204.

Figure 3A:
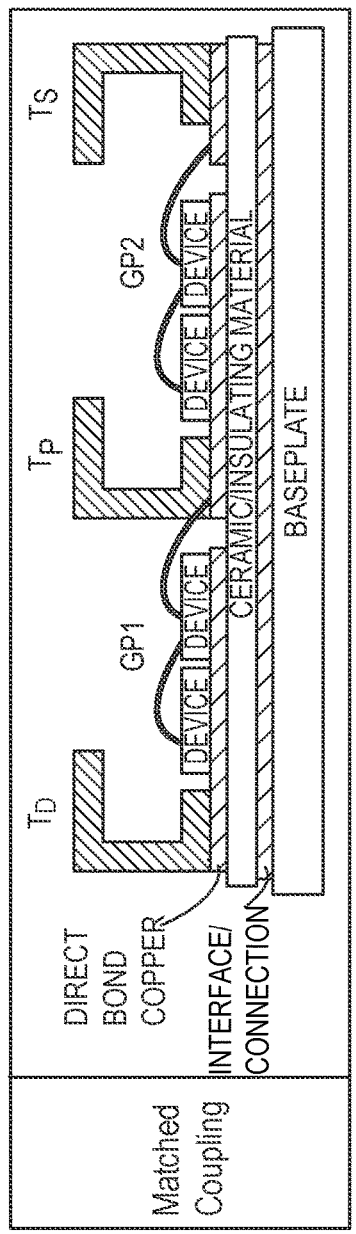
FIGS. 3A-3C illustrate cross-sectional views of different geometric configurations of one half-bridge power module.
Figure 3B:
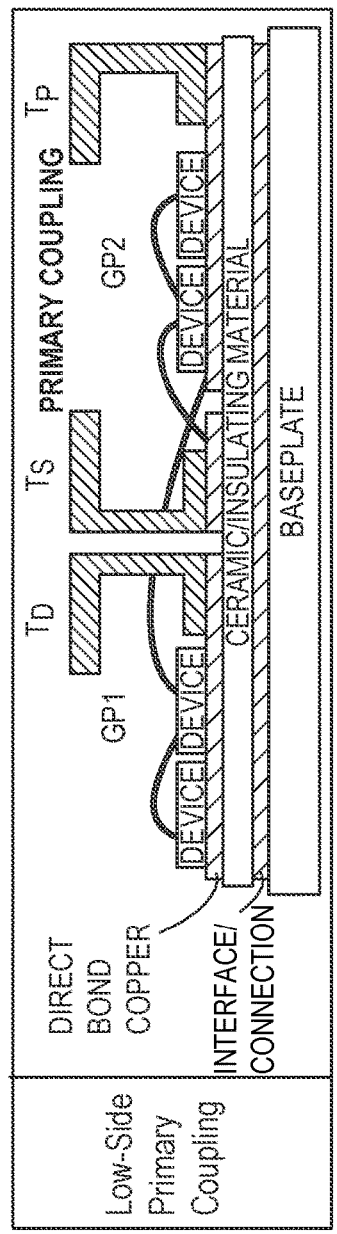
Figure 3C:
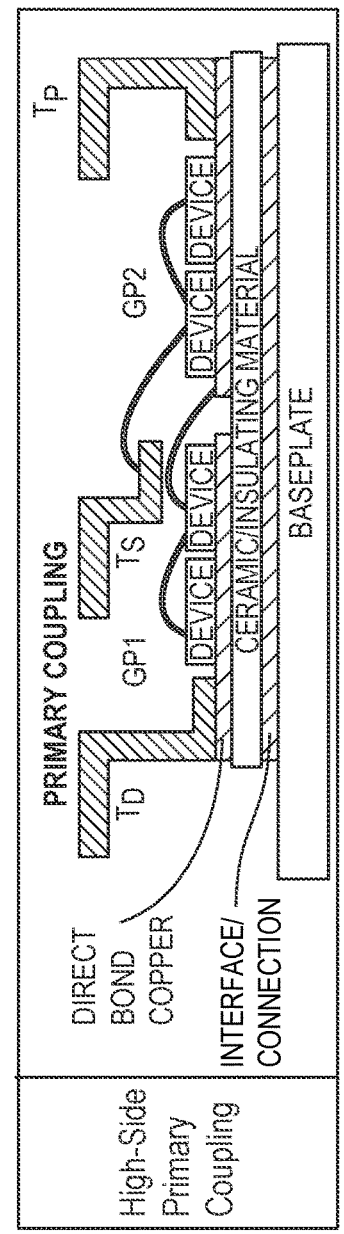

For different applications, due to different package designs, the primary mutual coupling within one power module with two gate paths may be located at different positions. FIGS. 3A-3C illustrate cross-sectional views of different geometric configurations of one power module. As illustrated in FIG. 3A, the first gate path GP1 is physically embedded between the drain terminal $T_D$ and the phase terminal $T_P$, and the second gate path GP2 is physically embedded between the phase terminal $T_P$ and the source terminal $T_S$. Herein and hereafter, for a two-gate-path power module, a gate path (e.g., the first gate path GP1) closer to the drain terminal $T_D$ is a high-side gate path, and the other gate path is a low-side gate path. With this geometric configuration, the high-side gate path (e.g., the first gate path GP1) and the low-side gate path (e.g., the second gate path GP2) may be substantially symmetrically coupled to the magnetic fields of the power path PP.

In FIG. 3B, the first gate path GP1 is the high-side gate path and physically located next to the drain terminal $T_D$, and the second gate path GP2 is the low-side gate path and physically embedded between the source terminal $T_S$ and the phase terminal $T_P$. Herein, the first gate path is not strongly coupled to the magnetic fields of the power path PP. As such, the primary mutual coupling occurs between the low-side gate path (e.g., the second gate path GP2) and the power path PP.

In FIG. 3C, similar to the half-bridge power module 200, the first gate path GP1 is the high-side gate path and physically embedded between the drain terminal $T_D$ and the source terminal $T_S$, and the second gate path GP2 is the low-side gate path and physically located next to the phase terminal $T_P$. Herein, the second gate path is not strongly coupled to the magnetic fields of the power path PP. As such, the primary mutual coupling occurs between the high-side gate path (e.g., the first gate path GP1) and the power path PP. Notice that, regardless of the relative physical locations of the drain terminal $T_D$, the phase terminal $T_P$, and the source terminal $T_S$, a current through the power path always goes from the drain terminal $T_D$, through the phase terminal $T_P$, and toward the source terminal $T_S$.

FIGS. 4A-4B illustrate a simulation model 400 to estimate the mutual coupling effect within the half-bridge power module 200 shown in FIG. 2A. The simulation model 400 is created by COMSOL Multiphysics. For simplification purposes, the simulation model only includes one gate path, the first gate path GP1 (i.e., the high-side gate path for the primary mutual coupling). In addition, since the first secondary parasitic inductors 208 and 212 in the half-bridge power module 200 are formed mainly due to the geometric configurations of the first and second secondary conductive structures 209 and 213 (e.g., the first gate terminal $T_{G1}$, the first Kelvin terminal $T_{K1}$, the first gate connecting components 210, the second gate terminal $T_{G2}$, the second Kelvin terminal $T_{K2}$, and the second gate connecting components 214 as shown in FIG. 2A), in the simulation model 400, the first MOSFETs 202 and the second MOSFETs 204 are replaced by simplified high-side components 402 (e.g., multiple small metal plates, for clarity purposes, only one high-side metal plate is labeled with reference number) and simplified low-side components 404 (e.g., multiple small metal plates, only one low-side metal plate is labeled with reference number), respectively.

Figure 5A:
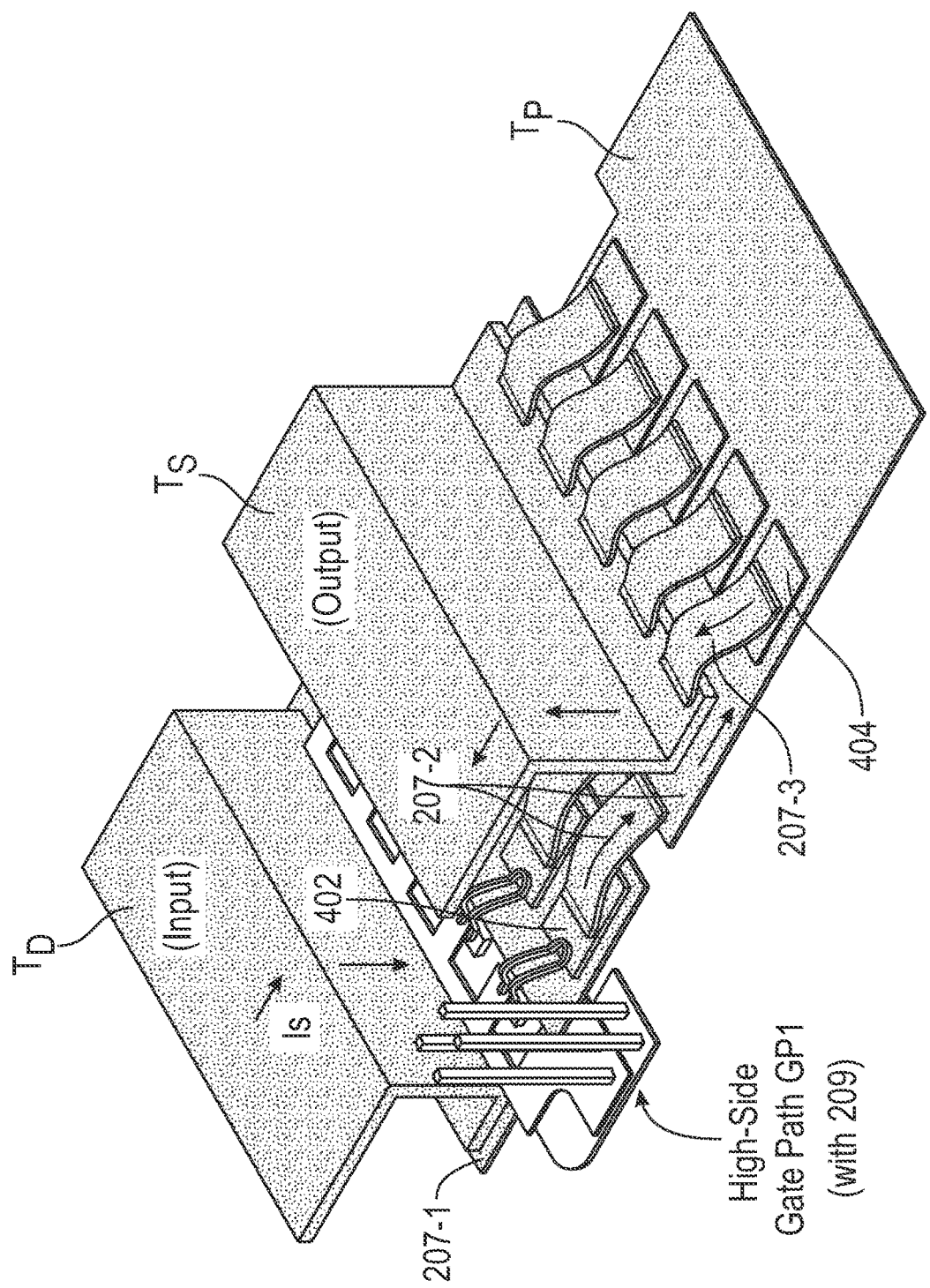
FIGS. 5A-5B illustrate a power path and a gate path within the simulation model shown in FIG. 4A.

With patterned highlights, FIG. 5A specifies the power path PP. Herein, a primary current stimulus $I_S$ is injected into the power path PP from the drain terminal $T_D$, through a first portion of the primary connecting components 207-1, through the high-side component 402, through a second portion of the primary connecting components 207-2, passing the phase terminal $T_P$, through the low-side component 404, through a third portion of the primary connecting components 207-3, and toward the source terminal $T_S$. The equivalent primary parasitic inductor 206 exists within the power path PP (e.g., between the drain terminal $T_D$ and the high-side component 402) due to the geometric configuration of the primary conductive structure 209, which includes the drain terminal $T_D$, the primary connecting components 207, the phase terminal $T_P$, and the source terminal $T_S$.

Figure 5B:
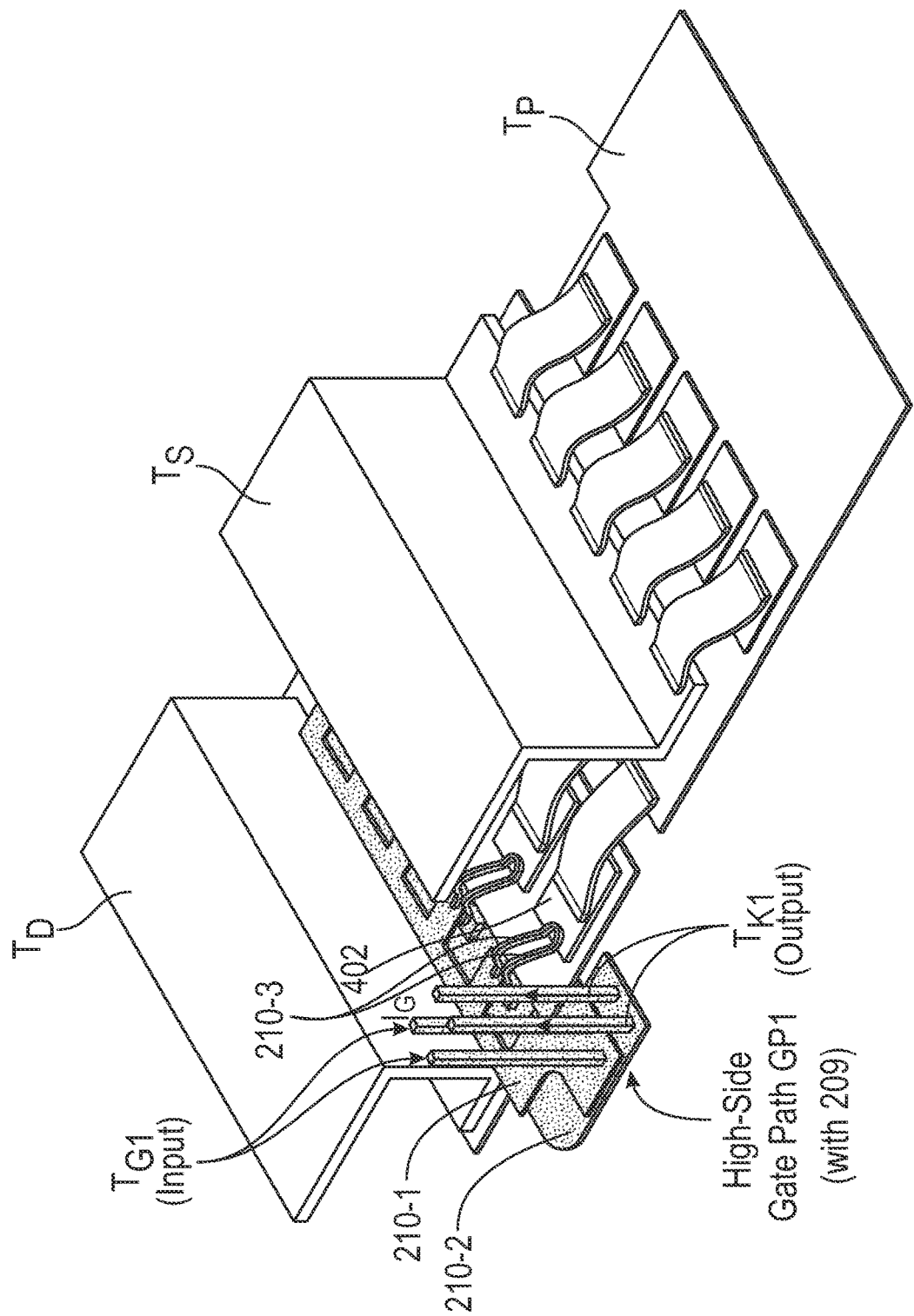

With patterned highlights, FIG. 5B specifies the first gate path GP1 (high-side gate path). Herein, a gate current stimulus $I_G$ is injected into the first gate path GP1 from the first gate terminal $T_{G1}$, through the first gate connecting components 210, passing the high-side component 402, and towards the first Kelvin terminal $T_{K1}$. In one embodiment, the first gate terminal $T_{G1}$ is composed of two input pins, and the first Kelvin terminal $T_{K1}$ is composed of two output pins. The first gate connecting components 210 include an input metal layer 210-1 in contact with the first gate terminal $T_{G1}$ (i.e., the two input pins), an output metal layer 210-2 in contact with the first Kelvin terminal $T_{K1}$ (i.e., the two output pins), and multiple wire leads 210-3 configured to connect the input metal layer 210-1 and the output metal layer 210-2 to the high-side component 402 (for clarity purposes, only selective wire leads are labeled with reference numbers). The equivalent first secondary parasitic inductor 208 exists within the first gate path GP1 (e.g., between the first gate terminal $T_{G1}$ and the high-side component 402) due to the geometric configuration of the first secondary conductive structure 209, which includes the first gate terminal $T_{G1}$, the first gate connecting components 210, and the first Kelvin terminal $T_{K1}$.

Notice that a different geometric configuration of one conductive structure (e.g., the first secondary conductive structure 209) will lead to a different parasitic inductance, and consequently, will change the parasitic mutual coupling effect. When the inductance of the first secondary parasitic inductor 208 decreases, the mutual coupling effect between the primary parasitic inductor 206 and the first secondary parasitic inductor 208 will be reduced. Herein, if the mutual coupling effect is negative, the smaller the inductance of the first secondary parasitic inductor 208, the less the gate current into the high-side components 402/the first MOSFETs 202 will be reduced, and the less the switching speed of each first MOSFET 202 will be reduced (see equations (1) and (2)). On the other hand, when the inductance of the first secondary parasitic inductor 208 increases, the mutual coupling effect between the primary parasitic inductor 206 and the first secondary parasitic inductor 208 will be enhanced. Herein, if the mutual coupling effect is positive, the larger the inductance of the first secondary parasitic inductor 208, the more the gate current into the high-side components 402/the first MOSFETs 202 will be increased, and the more the switching speed of each first MOSFET 202 will be increased (see equations (1) and (3)).

FIGS. 6A-6C illustrate a geometric configuration of one conductive structure, which can be used as a secondary conductive structure within either the first gate path GP1 or the second gate path GP2 (e.g., the first secondary conductive structure 209 or the second secondary conductive structure 213 within the half-bridge power module 200). As illustrated in FIG. 6A, a single-dimensional-symmetric-pin conductive structure 600A includes a gate terminal $T_{GA}$, a Kelvin terminal $T_{KA}$, and gate connecting components 602A. In one embodiment, the gate terminal $T_{GA}$ is composed of two individual input pins, and the Kelvin terminal $T_{KA}$ is composed of two individual output pins. The gate connecting components 602A include an input metal layer 602A-1, an output metal layer 602A-2 vertically aligned with the input metal layer 602A-1 (e.g., the output metal layer 602A-2 vertically underneath the input metal layer 602A-1), and multiple wire leads 602A-3 (for clarity purposes, only selective wire leads are labeled with reference numbers) configured to connect the input metal layer 602A-1/the output metal layer 602A-2 to corresponding MOSFETs (e.g., to the gate of each first MOSFET 202 or to the gate of each second MOSFET 204). Notice that the input metal layer 602A-1 and the output metal layer 602A-2 are not in direct contact. There may be a dielectric layer vertically between the input metal layer 602A-1 and the output metal layer 602A-2 (not shown for simplicity). The two individual input pins (i.e., the gate terminal $T_{GA}$) are in contact with the input metal layer 602A-1 and extend upward from a top surface of the input metal layer 602A-1 (e.g., extending along a Z dimension). The two individual output pins (i.e., the Kelvin terminal $T_{KA}$) are in contact with the output metal layer 602A-2 and extend upward from a top surface of the output metal layer 602A-2 (e.g., extending along the Z dimension). The two individual output pins are exposed through the input metal layer 602A-1. In addition, the two individual input pins and the two individual output pins are configured symmetrically in an X dimension, while there is no symmetrical requirement in a Y dimension and a Z dimension (the X, Y, and Z dimensions are all orthogonal to each other).

FIG. 6B illustrates an over-molded conductive structure 600B that includes a gate terminal $T_{GB}$, a Kelvin terminal $T_{KB}$, and gate connecting components 602B. The gate terminal $T_{GB}$ is composed of two connected input pins, and the Kelvin terminal $T_{KB}$ is composed of two connected output pins. In this embodiment, the gate connecting components 602B include an input metal layer 602B-1, an output metal layer 602B-2, and multiple wire leads 602B-3 (for clarity purposes, only selective wire leads are labeled with reference numbers) configured to connect the input metal layer 602B-1/the output metal layer 602B-2 to corresponding MOSFETs (e.g., to the gate of each first MOSFET 202 or to the gate of each second MOSFET 204). Herein, the input metal layer 602B-1 may have a first comb shape with multiple comb teeth, and the output metal layer 602B-2 may have a second comb shape with multiple comb teeth. The comb teeth of the input metal layer 602B-1 and the comb teeth of the output metal layer 602B-2 face a same direction and are staggered. The input metal layer 602B-1 and the output metal layer 602B-2 are not in direct contact and there may be a dielectric layer vertically between the input metal layer 602B-1 and the output metal layer 602B-2 (not shown for simplicity). The two connected input pins (i.e., the gate terminal $T_{GB}$) are in contact with the input metal layer 602B-1 and extend upward from a top surface of the input metal layer 602B-1 (e.g., extending along the Z dimension). The two connected output pins (i.e., the Kelvin terminal $T_{KB}$) are in contact with the output metal layer 602B-2 and extend upward from a top surface of the output metal layer 602B-2 (e.g., extending along Z dimension). In addition, the two connected input pins and the two connected output pins are configured symmetrically in the X dimension, while there is no symmetrical requirement in the Y dimension and the Z dimension.

A cross-pin conductive structure 600C, as illustrated in FIG. 6C, includes a gate terminal $T_{GC}$, a Kelvin terminal $T_{KC}$, and gate connecting components 602C. In one embodiment, the gate terminal $T_{GC}$ is composed of two individual input pins, and the Kelvin terminal $T_{KC}$ is composed of two individual output pins. The gate connecting components 602C include an input metal layer 602C-1, an output metal layer 602C-2 vertically aligned with the input metal layer 602C-1 (e.g., the output metal layer 602C-2 vertically underneath the input metal layer 602C-1), and multiple wire leads 602C-3 (for clarity purposes, only selective wire leads are labeled with reference numbers) configured to connect the input metal layer 602C-1/the output metal layer 602C-2 to corresponding MOSFETs (e.g., to the gate of each first MOSFET 202 or to the gate of each second MOSFET 204). Notice that the input metal layer 602C-1 and the output metal layer 602C-2 are not in direct contact. There may be a dielectric layer vertically between the input metal layer 602C-1 and the output metal layer 602C-2 (not shown for simplicity). The two individual input pins (e.g., the gate terminal $T_{GC}$) are in contact with the input metal layer 602C-1 and extend upward (e.g., along the Z dimension) from a top surface of the input metal layer 602C-1. The two individual output pins (i.e., the Kelvin terminal $T_{KC}$) are in contact with the output metal layer 602C-2, and extend upward (e.g., along the Z dimension) from a top surface of the output metal layer 602C-2 and vertically through the input metal layer 602C-1 without contact. In addition, the two individual input pins and the two individual output pins are configured symmetrically in both the X dimension and the Y dimension, while there is no symmetrical requirement in the Z dimension.

Each conductive structure 600A/600B/600C can be applied in the half-bridge power module 200 as the first secondary conductive structure 209 or the second secondary conductive structure 213. For one non-limited example, the first secondary conductive structure 209 within the first gate path GP1 and the second secondary conductive structure 213 within the second gate path GP2 are each the cross-pin conductive structure 600C. For one non-limited example, the first secondary conductive structure 209 within the first gate path GP1 is the cross-pin conductive structure 600C, while the second secondary conductive structure 213 within the second gate path GP2 is the single-dimensional-symmetric-pin conductive structure 600A. For one non-limited example, the first secondary conductive structure 209 within the first gate path GP1 is the over-molded conductive structure 600B, while the second secondary conductive structure 213 within the second gate path GP2 is the over-molded conductive structure 600B. In addition, each conductive structure 600A/600B/600C can be applied to the power modules shown in FIGS. 3A-3C. Furthermore, if a power module only includes one gate path, each conductive structure 600A/600B/600C can be applied in such gate path.

Figure 7:
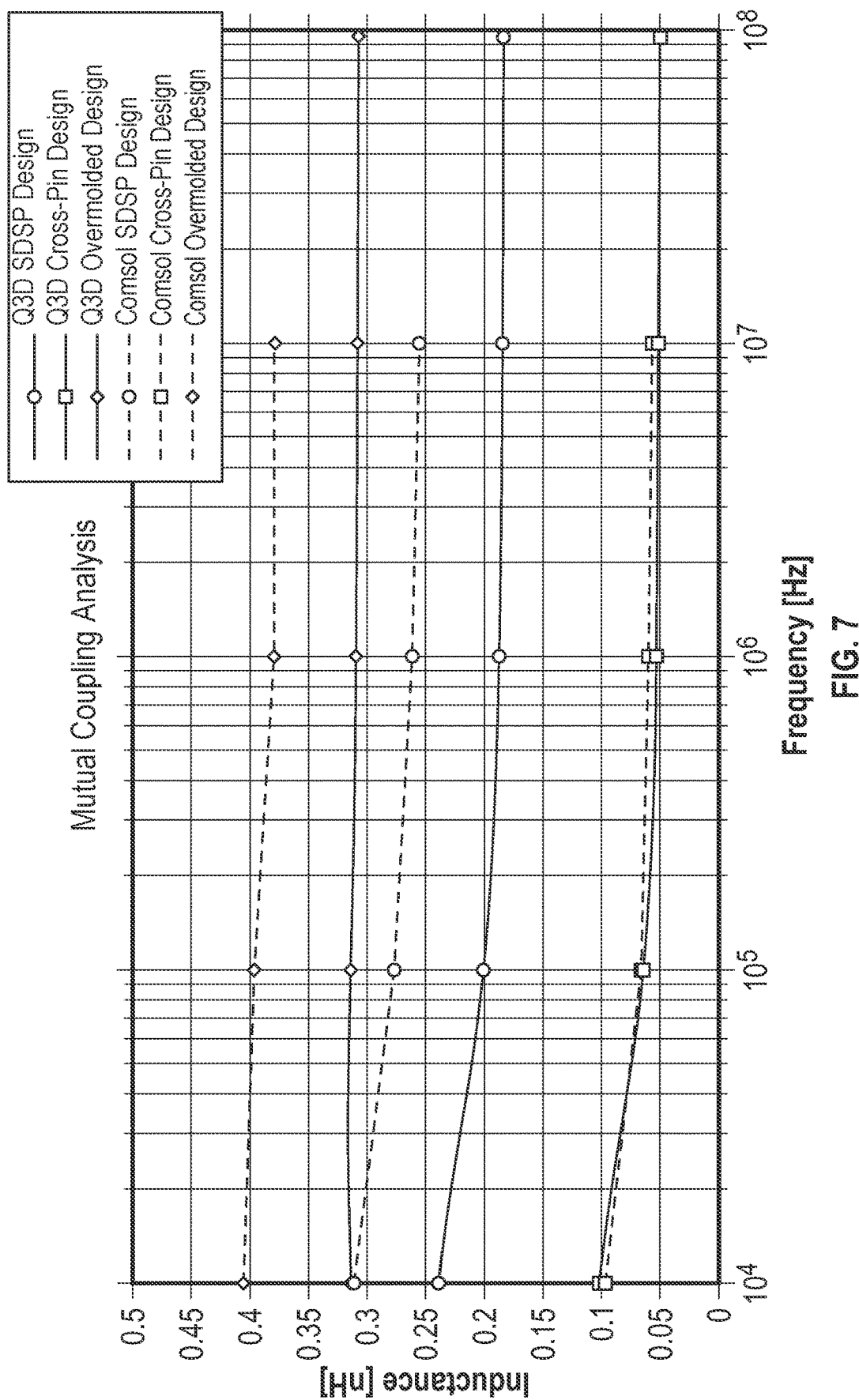
FIGS. 7-10 illustrate dynamic performance within the gate path based on the different geometric configurations of the conductive structure shown in FIGS. 6A-6C.

FIGS. 7-10 illustrate dynamic performances within the first gate path GP1 based on different conductive structures 600A/600B/600C (utilizing the simulation model 400 by COMSOL Multiphysics to estimate the half-bridge power module 200). FIG. 7 shows an inductance estimation of the first secondary parasitic inductor 208 based on different conductive structures 600A/600B/600C. In the COMSOL simulation, for a test frequency between 10 KHz and 10 MHZ, the cross-pin conductive structure 600C has a parasitic inductance between 0.1 nH and 0.051 nH, the single-dimensional-symmetric-pin (SDSP) conductive structure 600A has a parasitic inductance between 0.31 nH and 0.26 nH, and the over-molded conductive structure 600B has a parasitic inductance between 0.41 nH and 0.38 nH. FIG. 7 also shows the parasitic inductance estimation by another simulation software: ANSYS Q3D Extractor. By utilizing Q3D simulation, for the test frequency between 10 KHz and 10 MHZ, the cross-pin conductive structure 600C has a parasitic inductance between 0.11 nH and 0.5 nH, the single-dimensional-symmetric-pin conductive structure 600A has a parasitic inductance between 0.24 nH and 0.18 nH, and the over-molded conductive structure 600B has a parasitic inductance between 0.32 nH and 0.31 nH. While slight discrepancies between the COMSOL and Q3D simulations are observed for each conductive structure, both the COMSOL and Q3D simulations show the same trend. From the results, the cross-pin conductive structure 600C has the smallest parasitic inductance and exhibits the lowest amount of mutual coupling, while the over-molded conductive structure 600C has the largest parasitic inductance and exhibits the highest amount of mutual coupling.

Figure 8:
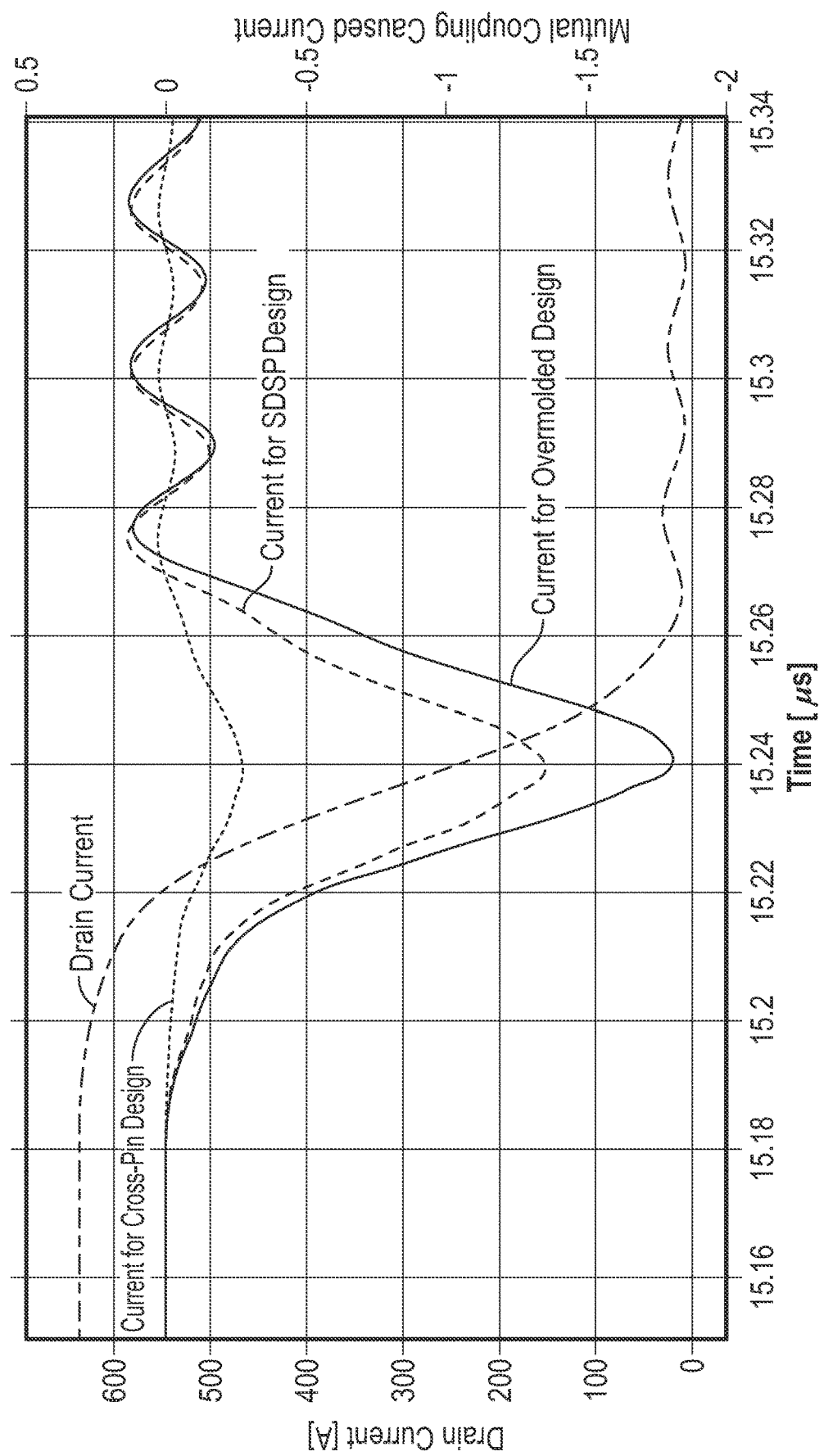

FIG. 8 shows an estimation of a transient current caused by the mutual coupling within the first gate path GP1 during a turn-off transient. Herein, a current injected into the power path PP (e.g., a drain current of all five first MOSFETs 202) turns to zero (e.g., turning off the first MOSFETs 202), and the transient current caused by the mutual coupling within the first gate path GP1 has different values based on different conductive structures 600A/600B/600C. When the cross-pin conductive structure 600C is utilized as the first secondary conductive structure 209 in the first gate path GP1, the transient current caused by the mutual coupling can jump to −0.2 A. When the single-dimensional-symmetric-pin conductive structure 600A is utilized as the first secondary conductive structure 209 in the first gate path GP1, the transient current caused by the mutual coupling can jump to −1.25 A. When the over-molded conductive structure 600B is utilized as the first secondary conductive structure 209 in the first gate path GP1, the transient current caused by the mutual coupling can jump to −1.8 A. Herein, the negative value of the transient current represents that the mutual coupling within the first gate path GP1 has a negative effect. It is clear that the cross-pin conductive structure 600C provides the smallest negative mutual coupling effect and will result in the lowest amount of switching speed reduction. The over-molded conductive structure 600B provides the largest negative mutual coupling effect and will result in the highest amount of switching speed reduction.

Figure 9:
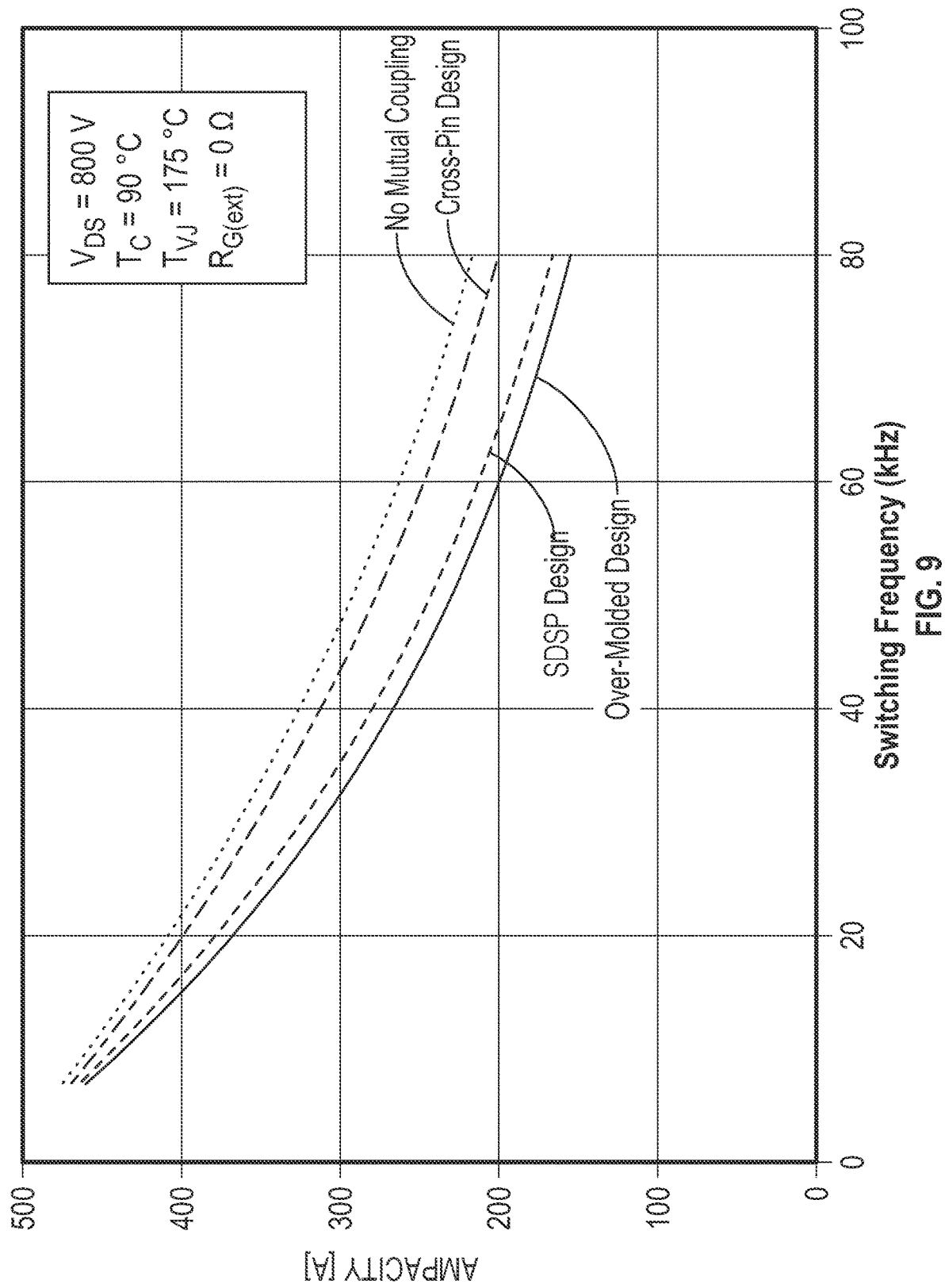

FIG. 9 illustrates an exemplary ampacity comparison of the first MOSFETs 202 (e.g., five first MOSFETs 202 in parallel) for the different conductive structures 600A/600B/600C when the mutual coupling has a negative effect. Also, FIG. 9 shows a case where the negative mutual coupling is omitted. Herein, a voltage across the drain D1 and the source S1 of each first MOSFET 202 $V_{DS}$=800V, a case temperature $T_C$=90° C., a virtual junction temperature Tvj=175° C., and an external gate resistance (e.g., similar to the gate resistor 104 in FIG. 1A) $R_{G(ext)}$=0Ω. It is clear that, with the negative mutual coupling, the cross-pin conductive structure 600C leads to the smallest ampacity reduction of the first MOSFETs 202, while the over-molded conductive structure 600B leads to the largest ampacity reduction of the first MOSFETs 202. At 80 kHz switching frequency of the first MOSFETs 202, the ampacity difference of the first MOSFETs 202 between using the cross-pin conductive structure 600C and using the over-molded conductive structure 600B is 50 A.

Notice that FIGS. 8-9 illustrate the transient performance when the mutual coupling has a negative effect. On the other hand, when the mutual coupling has a positive effect, the transient performance has similar results. The cross-pin conductive structure 600C will provide the smallest positive mutual coupling effect and will result in the lowest amount of switching speed enhancement. The over-molded conductive structure 600B will provide the largest positive mutual coupling effect and will result in the highest amount of switching speed enhancement. In addition, the cross-pin conductive structure 600C will lead to the smallest ampacity enhancement of the first MOSFETs 202, while the over-molded conductive structure 600B leads to the largest ampacity enhancement of the first MOSFETs 202.

Figure 10:
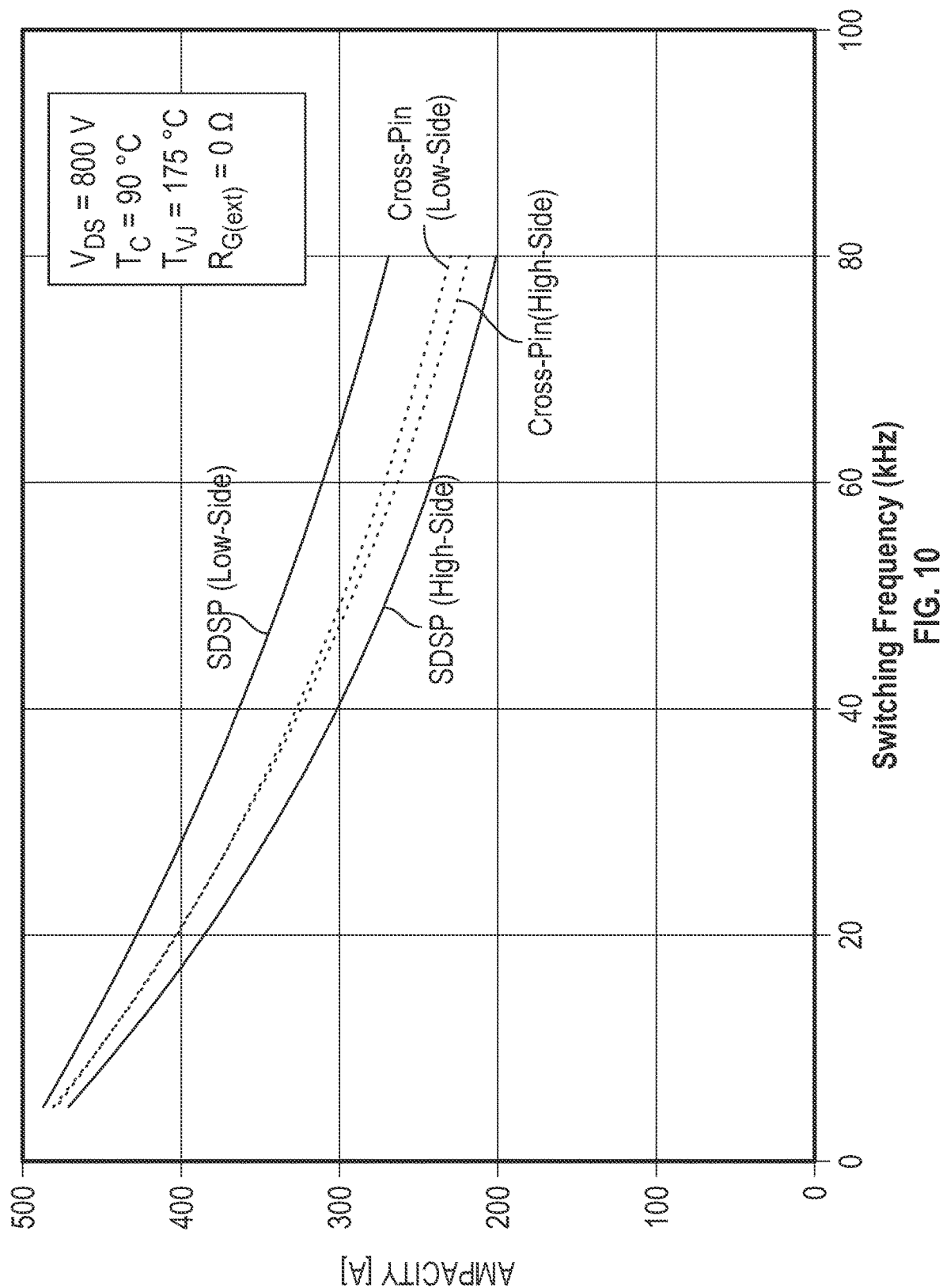

As described above, one power module with two gate paths (e.g., the half-bridge power module 200 shown in FIG. 2A or power modules shown in FIGS. 3B and 3C) may feature asymmetrical mutual coupling effects. If there is no mutual coupling existing in the half-bridge power module 200, the transient performance of the first MOSFETs 202 and the second MOSFETs 204 may match. Since the cross-pin conductive structure 600C leads to the smallest negative/positive mutual coupling effect, when the half-bridge power module 200 utilizes the cross-pin conductive structure 600C to both the first and second secondary conductive structures 209 and 213, the half-bridge power module 200 will feature substantially symmetrical mutual coupling effects (e.g., ampacity substantially matching, switching speed substantially matching, and the like). Herein, "substantially" refers to an error margin less than 10%. FIG. 10 illustrates an ampacity of both MOSFETs within the half-bridge power module 200. Herein, a voltage across the drain D1 and the source S1 of each first MOSFET 202 $V_{DS}$=800V, a case temperature $T_C$=90° C., a virtual junction temperature Tvj=175° C., and an external gate resistance (e.g., similar to the gate resistor 104 in FIG. 1A) $R_{G(ext)}$=0Ω. Both the mutual coupling for the first gate path GP1 and the mutual coupling for the second gate path GP2 have negative effects. For the single-dimensional-symmetric-pin conductive structure 600A, at 80 KHz switching frequency, the ampacity difference between the first MOSFETs 202 and the second MOSFETs 204 is 70 A (35% difference). For the cross-pin conductive structure 600C, at 80 kHz switching frequency, the ampacity difference between the first MOSFETs 202 and the second MOSFETs 204 is 11 A (about 5% difference). Notice that the 5% ampacity difference by utilizing the cross-pin conductive structure 600C is minor, and might be a measurement error, but not a real ampacity difference.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power module, comprising:
 a primary conductive structure that is connected to both a drain and a source of a field effect transistor (FET); and
 a secondary conductive structure with a gate terminal, a Kelvin terminal, and a plurality of gate connecting components, wherein:
  the plurality of gate connecting components is configured to connect the gate terminal to a gate of the FET and connect the Kelvin terminal to the source of the FET;
  wherein the gate terminal comprises a plurality of input pins, and the Kelvin terminal comprises a plurality of output pins;
  the plurality of gate connecting components comprises an input metal layer electrically connected with plurality of input pins and an output metal layer electrically connected with the plurality of output pins, wherein the plurality of output pins do not contact the input metal layer, wherein the output metal layer is on or overlapping the input metal layer.

2. The power module of claim 1, wherein the secondary conductive structure comprises a dielectric layer between the input metal layer and the output metal layer.

3. The power module of claim 1, wherein the plurality of input pins comprise two input pins and the plurality of output pins comprise two output pins.

4. The power module of claim 3, wherein the two input pins are exposed through the output metal layer.

5. The power module of claim 3, wherein the two input pins extend from the input metal layer in a Z dimension, wherein the two output pins extend from the output metal layer in the Z dimension, wherein the two input pins and the two output pins are symmetrical in an X dimension but not symmetrical in a Y dimension, wherein the X dimension, the Y dimension, and the Z dimension are orthogonal to each other.

6. The power module of claim 1, wherein the input metal layer has a first comb shape with a plurality of comb teeth.

7. The power module of claim 6, wherein the output metal layer has a second comb shape with a plurality of second comb teeth.

8. The power module of claim 7, wherein first comb teeth and the second comb teeth face a same direction and are staggered.

9. The power module of claim 3, wherein the two input pins extend from the input metal layer in a Z dimension, wherein the two output pins extend from the output metal layer in the Z dimension, wherein the two input pins and the two output pins are symmetrical in an X dimension and in a Y dimension, wherein the X dimension, the Y dimension, and the Z dimension are orthogonal to each other.

10. The power module of claim 1, wherein the power module is a half-bridge power module.

11. A power module, comprising:
 a primary conductive structure that is connected to both a drain and a source of a field effect transistor; and
 a first secondary conductive structure with a first gate terminal, a first Kelvin terminal, a first input metal layer having a first comb shape with a plurality of comb teeth, and a first output metal layer;
 a second secondary conductive structure with a second gate terminal, a second Kelvin terminal, a second input metal layer, and a second output metal layer;
 wherein a pin configuration for the first gate terminal and the first Kelvin terminal is different from a pin configuration for the second gate terminal and the second Kelvin terminal.

12. The power module of claim 11, wherein the first gate terminal comprises two first input pins, wherein the first Kelvin terminal comprises two first output pins, wherein the two first input pins extend from the first input metal layer in a Z dimension, wherein the two first output pins extend from the first output metal layer in the Z dimension, wherein the two first input pins and the two first output pins are symmetrical in an X dimension but not symmetrical in a Y dimension, wherein the X dimension, the Y dimension, and the Z dimension are orthogonal to each other;
 wherein the second gate terminal comprises two second input pins, wherein the second Kelvin terminal comprises two second output pins, wherein the two second input pins extend from the second input metal layer in the Z dimension, wherein the two second output pins extend from the second output metal layer in the Z dimension, wherein the two second input pins and the two second output pins are symmetrical in the X dimension and in the Y dimension.

13. The power module of claim 12, wherein the two first input pins are exposed through the first input metal layer.

14. The power module of claim 11, wherein the first output metal layer has a second comb shape with a plurality of second comb teeth.

15. The power module of claim 14, wherein first comb teeth and the second comb teeth face a same direction and are staggered.

16. The power module of claim 11, wherein the power module is a half-bridge power module.

17. A gate path for a half-bridge power module, comprising:
 a gate terminal comprising two input pins;
 a Kelvin terminal comprising two output pins;
 an input metal layer having a first comb shape with a plurality of comb teeth; and
 an output metal layer having a second comb shape with a plurality of second comb teeth;
 wherein the output metal layer has a same bottom plane as the input metal layer.

18. The gate path of claim 17, wherein first comb teeth and the second comb teeth face a same direction and are staggered.

19. A half-bridge power module, comprising the gate path of claim 17.

* * * * *